(12) United States Patent
Maishev et al.

(10) Patent No.: US 6,242,749 B1
(45) Date of Patent: Jun. 5, 2001

(54) ION-BEAM SOURCE WITH UNIFORM DISTRIBUTION OF ION-CURRENT DENSITY ON THE SURFACE OF AN OBJECT BEING TREATED

(76) Inventors: Yuri Maishev, Russian Federation 113204, Sumskoy Proezd 21, Bldg. 1, Apt. 43, Moscow (RU); James Ritter, 44856 Vista Del Sol, Fremont, CA (US) 94539; Leonid Velikov, 1371 Greenbrier Rd.; Alexander Shkolnik, 485 Dartmouth Ave., both of San Carlos, CA (US) 94070

( * ) Notice: Subject to any disclaimer, the term of this patent is extended or adjusted under 35 U.S.C. 154(b) by 0 days.

(21) Appl. No.: 09/240,469

(22) Filed: Jan. 30, 1999

(51) Int. Cl.[7] ...................................................... H01J 27/02
(52) U.S. Cl. ................ 250/423 R; 250/427; 315/111.81; 315/111.41; 315/111.01; 313/360.1; 313/362.1
(58) Field of Search ................................. 250/423 R, 427; 315/111.81, 111.41, 111.01; 313/360.1, 362.1

(56) References Cited

U.S. PATENT DOCUMENTS

| | | | |
|---|---|---|---|
| 4,122,347 | 10/1978 | Kovalsky et al. | 250/423 R |
| 4,684,848 | 8/1987 | Kaufman | 315/111.81 |
| 6,130,507 | * 10/2000 | Maishev et al. | 315/111.81 |
| 6,153,067 | * 11/2000 | Maishev et al. | 204/298.04 |

FOREIGN PATENT DOCUMENTS 2030807    3/1995   (RU) .

* cited by examiner

Primary Examiner—Jack Berman
Assistant Examiner—Nikita Wells (57) ABSTRACT

The invention provides a multiple-cell ion-beam source in which magnetic poles of all adjacent cells have alternating polarities, i.e., the cells arranged in a single row from the center to the periphery of the cathode plate have polarities in the order of N-S-N-S-N . . . , etc. As a result, the direction of magnetic lines of forces in the aforementioned rows alternates, and therefore the magnetic flux is not accumulated towards the center. This means that the source of such a construction does not have dimensional limitations and ensures uniform distribution of the ion-beam current density over the entire surface of the object. Intensity of the magnetic field for each individual cell can be controlled individually. This allows adjustment in the distribution of the ion-beam current density over the surface of the object.

16 Claims, 8 Drawing Sheets

ION-BEAM SOURCE WITH UNIFORM DISTRIBUTION OF ION-CURRENT DENSITY ON THE SURFACE OF AN OBJECT BEING TREATED

FIELD OF THE INVENTION

The present invention relates to the field of ion-emission technique, particularly to an ion source with uniform ion-beam current density on the surface of an object being treated. The ion-beam source of the invention is intended for etching, cleaning, activation, polishing, or thin-film coating of objects with large surface areas.

BACKGROUND OF THE INVENTION AND DESCRIPTION OF THE PRIOR ART

An ion source is a device that ionizes gas molecules and then focuses, accelerates, and emits them as a narrow beam. This beam is then used for various technical and technological purposes such as cleaning, activation, polishing, thin-film coating, or etching.

An example of wide-aperture type ion sources intended for treating objects with large surface area is the so-called Kaufman ion source, also known as a Kaufman ion engine or an electron-bombardment ion source described in U.S. Pat. No. 4,684,848 issued to H. R. Kaufman in 1987.

This ion source consists of a discharge chamber, in which plasma is formed, and an ion-optical system, which generates and accelerates an ion beam to an appropriate level of energy. A working medium is supplied to the discharge chamber, which contains a hot cathode that functions as a source of electrons and is used for igniting and maintaining a gas discharge. The plasma, which is formed in the discharge chamber, acts as an emitter of ions and creates, in the vicinity of the ion-optical system, an ion-emitting surface. As a result, the ion-optical system extracts ions from the aforementioned ion-emitting surface, accelerates them to a required energy level, and forms an ion beam of a required configuration. Typically, aforementioned ion sources utilize two-grid or three-grid ion-optical systems.

A disadvantage of such a device is that it does not provide a uniform ion-emitting surface, especially when the ion-emitting surface is large. Another disadvantage is that it requires the use of ion accelerating grids which contaminate the ion beam, and hence the surface of the object, as a result of sputtering of the material from the surface of the grid-like electrode. Another disadvantage of the Kaufman ion sources is that the ion beams emitted from such sources are still of insufficient intensity.

Attempts have been made to provide ion sources with ion beams of higher intensity by holding the electrons in a closed space between a cathode and an anode where the electrons could be held. For example, U.S. Pat. No. 4,122,347 issued in 1978 to Kovalsky et al. describes an ion source with a closed-loop trajectory of electrons for ion-beam etching and deposition of thin films, wherein the ions are taken from the boundaries of a plasma formed in a gas-discharge chamber with a hot cathode. The ion beam is intensified by a flow of electrons which are held in crossed electrical and magnetic fields within the accelerating space and which compensate for the positive spatial charge of the ion beam.

A disadvantage of devices of such type is that they do not allow formation of ion beams of chemically-active substances for ion beams capable of treating large surface areas. Other disadvantages of the aforementioned devices are short service life and high non-uniformity of ion beams.

Russian Patent No. 2,030,807 issued in 1995 to M. Parfenyonok, et al. describes an ion source that comprises a magnetoconductive housing used as a cathode having an ion-emitting slit, an anode arranged in the housing symmetrically with respect to the emitting slit, a magnetomotance source, a working gas supply system, and a source of electric power supply.

For better understanding the construction and principle of operation of an ion-beam source with a closed-loop ion-beam emitting slit and electrons drifting in crossed electric and magnetic fields, to which the present invention pertains, it would be expedient to describe the construction and operation of such a source in more detail.

Figure 1:
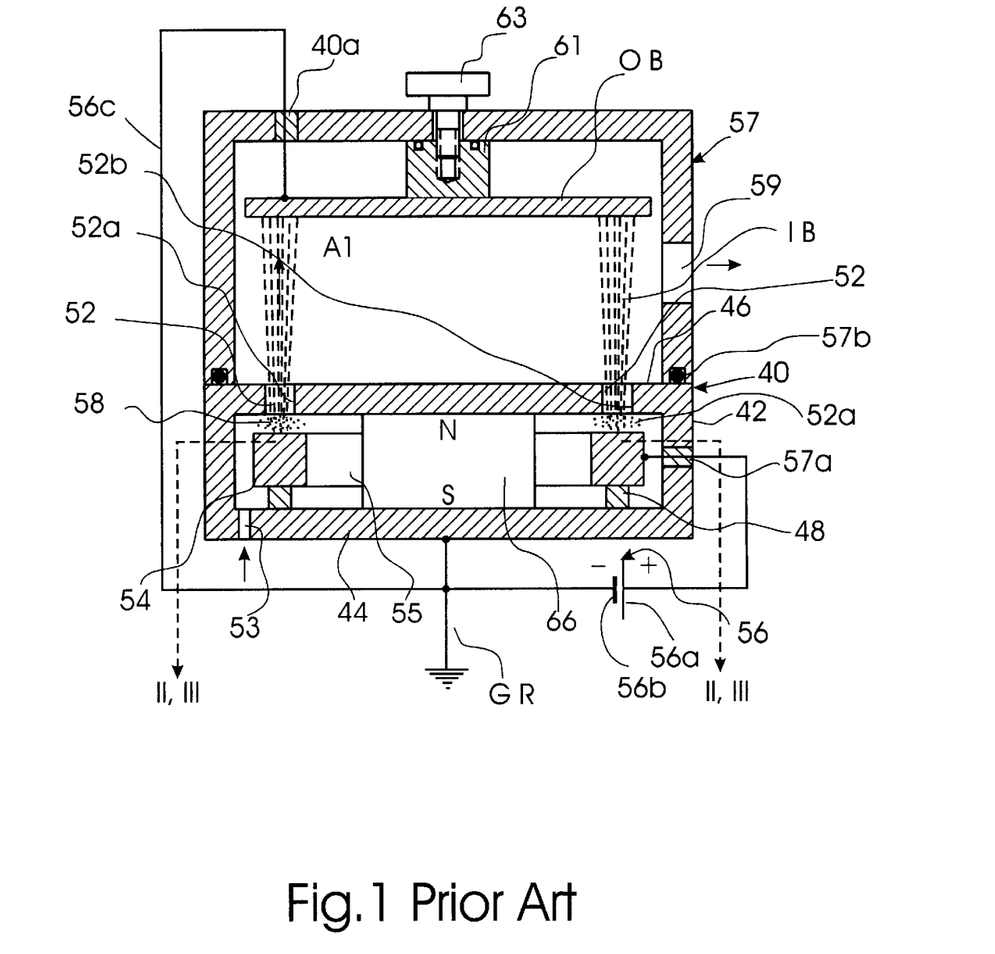
FIG. 1 is a sectional side view of a known ion-beam source with a circular ion-beam emitting slit.
Figure 2:
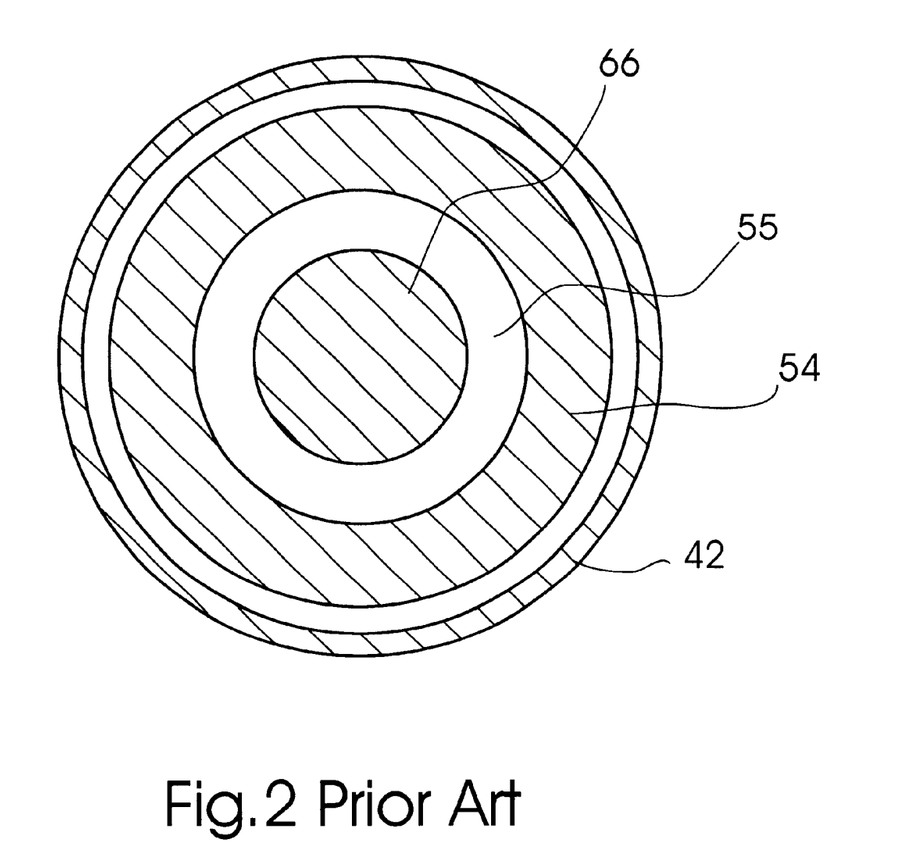
FIG. 2 is a sectional plan view along line II—II of FIG. 1.

FIGS. 1 and 2 schematically illustrate the aforementioned known ion source with a circular ion-beam emitting slit. More specifically, FIG. 1 is a sectional side view of an ion-beam source with a circular ion-beam emitting slit, and FIG. 2 is a sectional plan view along line II—II of FIG. 1.

The ion source of FIGS. 1 and 2 has a hollow cylindrical housing 40 made of a magnetoconductive material such as Armco steel (a type of mild steel), which is used as a cathode. Cathode 40 has a cylindrical side wall 42, a closed flat bottom 44 and a flat top side 46 with a circular ion emitting slit 52.

A working gas supply hole 53 is formed in flat bottom 44. Flat top side 46 functions as an accelerating electrode. Placed inside the interior of hollow cylindrical housing 40 between bottom 44 and top side 46 is a magnetic system in the form of a cylindrical permanent magnet 66 with poles N and S of opposite polarity. An N-pole faces flat top side 46 and S-pole faces bottom side 44 of the ion source. The purpose of a magnetic system 66 with a closed magnetic circuit formed by parts 66, 40, 42, and 44 is to induce a magnetic field in ion emitting slit 52. It is understood that this magnetic system is shown only as an example and that it can be formed in a manner described, e.g., in aforementioned U.S. Pat. No. 4,122,347. A circular annular-shaped anode 54, that is connected to a positive pole 56a of an electric power source 56, is arranged in the interior of housing 40 around magnet 66 and concentric thereto. Anode 54 is fixed inside housing 40 by means of a ring 48 made of a non-magnetic dielectric material such as ceramic. Anode 54 has a central opening 55 in which aforementioned permanent magnet 66 is installed with a gap between the outer surface of the magnet and the inner wall of opening 55. A negative pole 56b of electric power source is connected to housing 40, which is grounded at GR.

Located above housing 40 of the ion source of FIGS. 1 and 2 is a sealed vacuum chamber 57 which has an evacuation port 59 connected to a source of vacuum (not shown). An object OB to be treated is supported within chamber 57 above ion emitting slit 52, e.g., by connecting it to an insulator block 61 rigidly attached to the housing of vacuum chamber 57 by a bolt 63 but so that object OB remains electrically and magnetically isolated from the housing of vacuum chamber 57. However, object OB is electrically connected via a line 56c to negative pole 56b of power source 56. Since the interior of housing 40 communicates with the interior of vacuum chamber 57, all lines that electrically connect power source 56 with anode 54 and object OB should pass into the interior of housing 40 and vacuum chamber 57 via conventional commercially-produced electrical feedthrough devices which allow electrical connections with parts and mechanisms of sealed chambers without violation of their sealing conditions. In FIG. 1, these feedthrough devices are shown schematically and designated by reference numerals 40*a* and 57*a*. Reference numeral 57*b* designates a seal for sealing connection of vacuum chamber 57 to housing 40.

The known ion source of the type shown in FIGS. 1 and 2 is intended for the formation of a unilaterally directed tubular ion beam. The source of FIGS. 1 and 2 forms a tubular ion beam IB emitted in the direction of arrow A and operates as follows.

Vacuum chamber 57 is evacuated, and a working gas is fed into the interior of housing 40 of the ion source. A magnetic field is generated by magnet 66 in the accelerating gap between anode 54 and cathode 40, whereby electrons begin to drift in a closed path within the crossed electrical and magnetic fields. Plasma 58 is formed between anode 54 and cathode 40. When the working gas is passed through the ionization gap, tubular ion beam IB, which is propagated in the axial direction of the ion source shown by an arrow A, is formed in the area of an ion-emitting slit 52 and in an accelerating gap 52*a* between anode 54 and cathode 40.

The above description of the electron drift is simplified to ease understanding of the principle of the invention. In reality, the phenomenon of generation of ions in the ion source with a closed-loop drift of electrons in crossed electric and magnetic fields is of a more complicated nature and consists in the following.

When, at starting the ion source, a voltage between anode 54 and cathode 40 reaches a predetermined level, a gas discharge occurs in anode-cathode gap 52*a*. As a result, the electrons, which have been generated as a result of ionization, begin to migrate towards anode 54 under the effect of collisions and oscillations. After being accelerated by the electric field, the ions pass through ion-emitting slit 52 and are emitted from the ion source. Inside the ion-emitting slit, the crossed electric and magnetic fields force the electrons to move along closed cycloid trajectories. This phenomenon is known as "magnetization" of electrons. The magnetized electrons remain drifting in a closed space between two parts of the cathode, i.e., between those facing parts of cathode 40 which form ion-emitting slit 52. The radius of the cycloid is, in fact, the so-called doubled Larmor radius $R_L$ which is represented by the following formula:

$$R_L = m_e V/|e|B,$$

where $m_e$ is a mass of the electron, B is the strength of the magnetic field inside the slit, V is a velocity of the electrons in the direction perpendicular to the direction of the magnetic field, and $|e|$ is the charge of the electron.

It is required that the height of the electron drifting space in the ion-emission direction be much greater than the aforementioned Larmor radius. This means that a part of the ionization area penetrates into ion-emitting slit 52 where electrons can be maintained in a drifting state over a long period of time. In other words, a spatial charge of high density is formed in ion-emitting slit 52.

When a working medium, such as argon which has neutral molecules, is injected into the slit, the molecules are ionized by the electrons present in this slit and are accelerated by the electric field. As a result, the thus formed ions are emitted from the slit towards the object. Since the spatial charge has high density, an ion beam of high density is formed. This beam can be converged or diverged by known technique for specific applications.

Thus, the electrons do not drift in a plane, but rather along cycloid trajectories across ion-emitting slit 52. However, for the sake of convenience of description, here and hereinafter such expression as "electron drifting plane" or "drifting in the plane of ion-beam propagation" will be used.

The diameter of the tubular ion beam formed by means of such an ion source may reach 500 mm and more.

Figure 3:
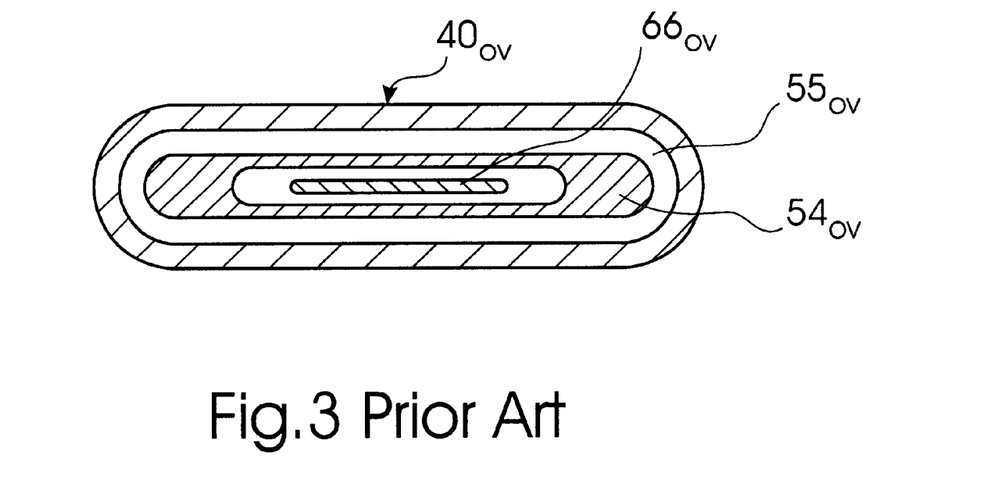
FIG. 3 is a cross-sectional view of the ion-beam source along line III—III of FIG. 1.

The ion source of the type shown in FIG. 1 is not limited to a cylindrical configuration and may have an elliptical or an oval-shaped cross section as shown in FIG. 3. FIG. 3 is a cross-sectional view of the ion-beam source along line III—III of FIG. 1. In FIG. 3 the parts of the ion beam source that correspond to similar parts of the previous embodiment are designated by the same reference numerals with an addition of subscript OV. Structurally, this ion source is the same as the one shown in FIG. 1 with the exception that a cathode 40$_{ov}$, anode 54$_{ov}$, a magnet 66$_{ov}$, and hence an emitting slit (not shown in FIG. 3), have an oval-shaped configuration. As a result, a belt-like ion beam having a width of up to 1400 mm can be formed. Such an ion beam source is suitable for treating large-surface objects when these objects are passed over ion beam IB emitted through emitting slit 52.

With 1 to 3 kV on the anode and various working gases, this source makes it possible to obtain ion beams with currents of 0.5 to 1 A. In this case, an average ion energy is within 400 to 1500 eV, and nonuniformity of treatment over the entire width of a 1400 mm-wide object does not exceed ±5%.

A disadvantage of the device described above is that, in treating objects of large surface areas, it does not provide uniformity in distribution of ion current density over the surface of an object being treated. Another disadvantage is that the distribution pattern of the ion-current density on the object surface cannot be controlled or adjusted. An increase in the intensity of the ion-beam current densities by increasing the area of the ion-emitting surface is limited.

Figure 4:
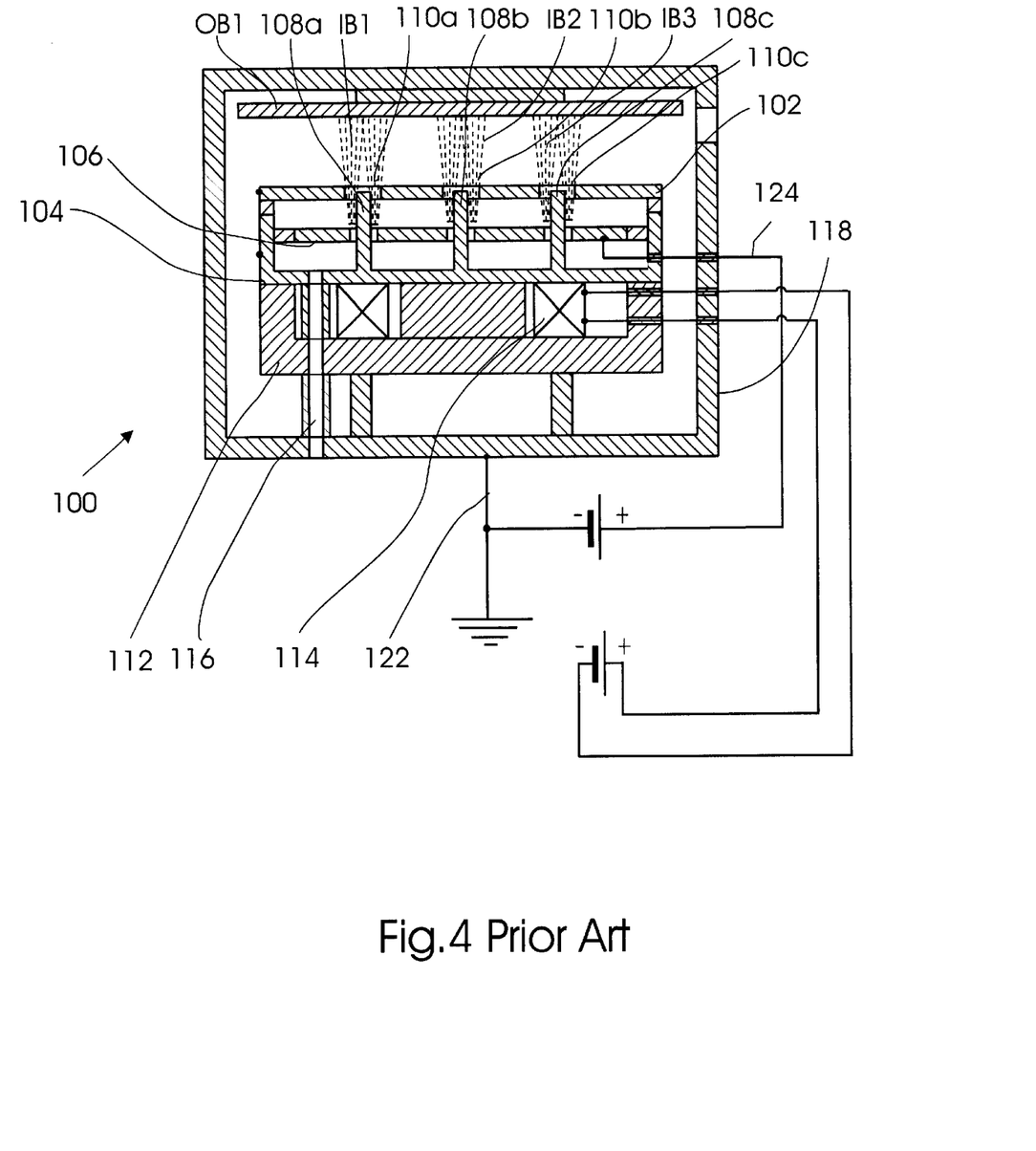
FIG. 4 is a sectional view of a known multiple-cell ion-beam source with the drift of electrons in crossed electric and magnetic fields.

An attempt has been made to improve uniformity of the current density distribution on the surface of the object by proving a multiple-cell ion-beam sources. One such device is described in USSR Author's Certificate No. 865043. As shown in FIG. 4, which is an elevational sectional view of the ion-beam source 100 of the aforementioned type, the device is made in the form of a multiple-cell source having two cathode plates 102 and 104 which function as magnetic poles. An anode plate 106 with openings is placed between cathode plates 102 and 106. Cathode plate 104 has rods 108*a*, 108*b*, 108*c*, which extend from cathode plate 104 to second cathode plate 102. Second cathode plate 102 has openings 110*a*, 110*b*, 110*c* coaxial with respective rods 108*a*, 108*b*, 108*c* and with openings in anode plate 106. The anode-cathode assembly is supported by a cup-shaped housing 112 of a magnetoconductive material, which contains an electromagnetic coil 114 for generating the aforementioned magnetic field in a anode-cathode space of ion source 100. In a conventional manner, entire ion source 100 is placed into a sealed vacuum chamber 118. A working medium is supplied to vacuum chamber via a working medium supply channel 116.

Rods 108*a*, 108*b*, 108*c* can be made of a magnetic or nonmagnetic material.

Thus, each opening 110*a*, 110*b*, 110*c* in cathode plate 102 and a respective coaxial rod 108*a*, 108*b*, 108*c* of the device form an individual ion-beam source of the type described above, i.e., of the type disclosed in Russian Patent No. 2,030,807. More specifically, the end of each rod and the adjacent opening in cathode plate 102 form a closed-loop ion-beam emitting slit, so that all rods and the openings in the second cathode plate form a plurality of such slits. In the context of the present invention, a combination of one rod with a respective opening will be referred to as a "cell", and the ion-beam source of this type will be called a "multiple-cell type ion-beam source". Cathode plates 102 and 104 are electrically isolated from anode plate 106 and grounded via a conductor 122. Anode plate 106 is connected to a source of a positive potential (not shown) via a conductor 124.

In operation, a working medium is supplied through channel 116 to the accelerating and ion-generating space between anode plate 106 and cathode plates 102, 104, and a potential difference is developed between the cathode plates and the anode plate. This generates crossed electric and magnetic fields in the aforementioned ion-emitting slits. These fields hold drifting electrons which ionize the working medium and compensate for the spatial charge of the ion beams IB1, IB2, IB3, which are emitted toward an object OB1 via openings in the second cathode plate. Object OB1 is fixed inside vacuum chamber 118.

Although the multiple-channel ion-beam source of the type described above to some extent improves uniformity of ion-current density distribution on the surface of an object being treated, it has a limitation with regard to the dimensions of the cathode plate for treating objects of large surface area.

Figure 5:
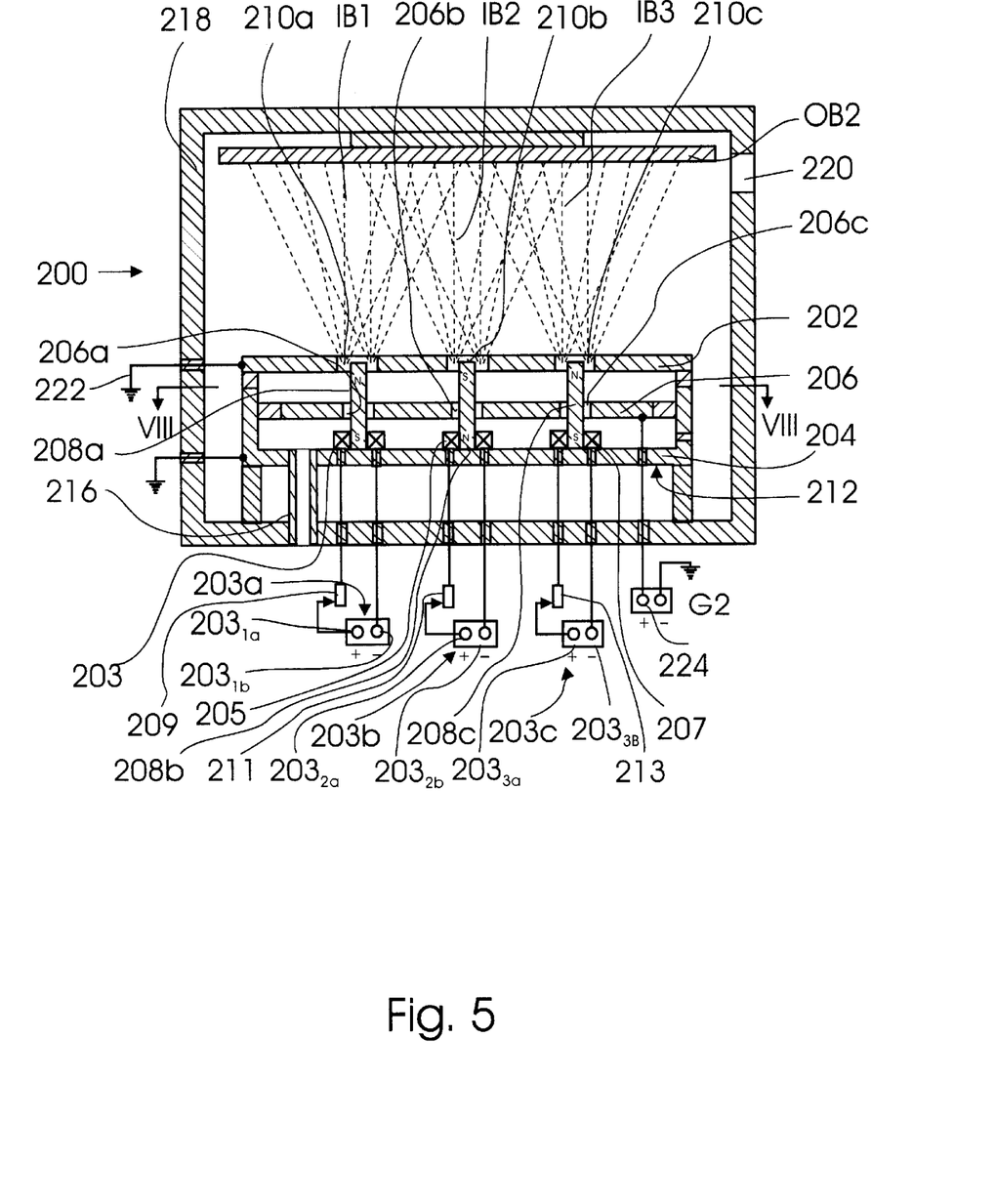
FIG. 5 is a multiple-cell ion-beam source of the invention with generation of magnetic fields in the cells by mean of electromagnetic coils.
Figure 5A:
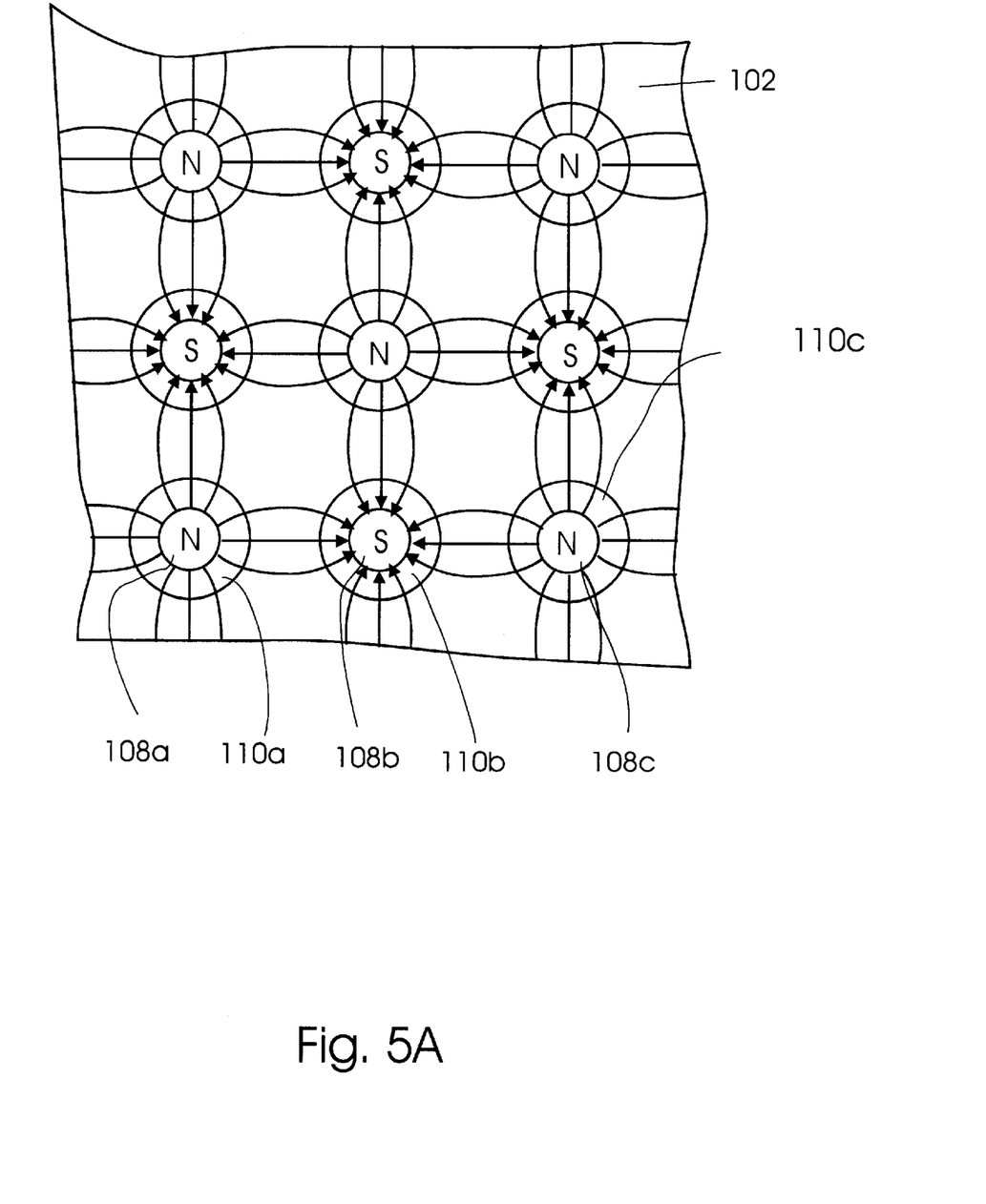
FIG. 5A is a view illustrating directions of magnetic lines of forces in adjacent cells.

More specifically, as shown in FIG. 5A, which is a fragmental top view illustrating lines of magnetic fields in adjacent cells, the magnetic flux generated by electromagnetic coil 114 (FIG. 4) in individual cells decreases towards the periphery of cathode plate 102 in proportion to R, if cathode plate 102 is round (where R is a current radius from the center to the periphery). This is because all the cells have magnetic poles of the same sign on the side of plate 102, so that the resulting magnetic flux is increased and its intensity is accumulated towards the cathode plate center. As a result, the material of the cathode, which normally is a mild steel such as Armco steel, is magnetically saturated, so that intensity of magnetic fields in the central cells is decreased. This results in nonuniformities in the distribution of the ion-current densities over the surface of the object being treated. Therefore an increase in the diameter or in the overall dimensions of the cathode plates is limited, since as the greater the cathode diameter, the greater is nonuniformities in the distribution of the magnetic flux over the cathode plate.

Another disadvantage of the multiple-cell ion-beam source of the aforementioned type is that it does not allow control or adjustment in the distribution of the ion current-density over the surface of the object.

OBJECTS OF THE INVENTION

It is an object of the present invention to provide a multiple-cell ion-beam source with electrons drifting in crossed electrical and magnetic fields, which is characterized by high uniformity in the distribution of ion-current density on the surface of the object, does not have limitations with regard to an increase in the cathode-plate diameter, and allows for control and adjustment in the distribution of the ion-current density on the surface of the object being treated.

SUMMARY OF THE INVENTION

The invention provides a multiple-cell ion-beam source in which magnetic poles of all adjacent cells have alternating polarities, i.e., the cells arranged in a single row from the center to the periphery of the cathode plate have polarities in the order of N-S-N-S-N . . . , etc. As a result, the direction of magnetic lines of forces in the aforementioned rows alternates, and therefore the magnetic flux is not accumulated towards the center. This means that the source of such a construction does not have dimensional limitations and ensure uniform distribution of the ion-beam current density over the entire surface of the object. Intensity of the magnetic field for each individual cell can be controlled individually. This allows adjustment in the distribution of the ion-beam current density over the surface of the object.

DETAILED DESCRIPTION OF THE INVENTION

A multiple-cell ion-beam source 200 according to one embodiment of the invention, in which generation of magnetic fields in the cells is performed by electromagnetic coils is, shown in FIG. 5.

Ion source 200 consists of two cathode plates 202 and 204 and an anode plate 206 with openings 206a, 206b, 206c, which is placed between cathode plates 202 and 204. Cathode plate 204 has rods 208a, 208b, 208c which extend from cathode plate 204 to second cathode plate 202 through the openings of anode plate 206 and function as cores of individual electromagnetic coils 203, 205, 207. Each coil 203, 205, 207 is energized from a respective direct current source 203a, 203b, 203c. Current sources 203a, 203b, 203c have positive terminals $203_{1a}$, $203_{2a}$, $203_{3a}$, respectively, and negative terminals $203_{1b}$, $203_{2b}$, $203_{3b}$, respectively. The positive and negative terminals of the adjacent current sources are connected to terminals of respective adjacent coils in alternating orders in such a way that magnetic poles formed on rods 208a, 208b, 208c have alternating polarities on the ends facing cathode plate 202, i.e., the end of rod 208a has a Northern pole, the end of rod 208b has a Southern pole, and the end of rod 208c has a Northern pole. The same alternating polarity exists in cross-sectional planes perpendicular to the plane of the drawing. Variable resistors 209, 211, 213 are inserted into electric circuits between respective coils 203, 205, 207 and power sources 203a, 205a, 207a for adjusting the intensity of the magnetic fields. Cathode plate 202 has openings 210a, 210b, 210c coaxial with respective rods 208a, 208b, 208c and with openings 206a, 206b, 206c in anode plate 206, through which rods 208a, 208b, 208c pass toward cathode plate 202. The anode-cathode assembly is supported by a cup-shaped housing 212 of a nonconductive material, such as a ceramic, which may contain aforementioned electromagnetic coils 203, 205, 207 and current supply sources 203a, 205a, 207a.

In a conventional manner, entire ion source 200 is placed into a sealed vacuum chamber 218. A working medium is supplied to vacuum chamber 218 via a working medium supply channel 216. The interior of chamber 218 is evacuated by a vacuum pump (not shown) via an exhaust port 220.

Cathode plate 202 is grounded via a conductor 222. Anode plate 206 is connected to a positive terminal of a power source 224, the negative terminal of which is grounded at G2.

Thus, each opening 210a, 210b, 210c in cathode plate 202 and a respective coaxial rod 208a, 208b, 208c of the device forms an individual ion-beam source of the type described above, i.e., of the type disclosed in Russian Patent No. 2,030,807. More specifically, the end of each rod and the adjacent opening in cathode plate 202 forms a closed-loop ion-beam emitting slit, so that all rods and the openings in the second cathode plate form a plurality of such slits. In operation, a working medium is supplied through channel 216 to the accelerating and ion-generating space between anode plate 206 and cathode plates 202, 204, and a potential difference is developed between the cathode plates and the anode plate. This generates crossed electric and magnetic fields in the anode-cathode space. These fields hold drifting electrons which ionize the working medium and compensate for the spatial charge of the ion beams IB1, IB2, IB3, which are emitted toward an object OB2 via openings in cathode plate 202. Object OB2 is fixed inside vacuum chamber 218.

During operation, ion source 200 provides magnetic poles of all adjacent cells with alternating polarities, i.e., the cells arranged in a single row from the center to the periphery of cathode plate 202 have polarities in the order of N-S-N-S-N . . . , etc. As a result, the direction of magnetic lines of forces in the aforementioned rows alternates, and therefore the magnetic flux is not accumulated towards the periphery. This means that the source of such a construction does not have dimensional limitations and ensure uniform distribution of the ion-beam current density over the entire surface of object OB2. Intensity of the magnetic field for each individual cell can be controlled individually by means of variable resistors 209, 211, 213. This allows adjustment in the distribution of the ion-beam current density over the surface of object OB2 and provides any pattern of ion-beam current density distribution, for example, more intensive treatment on the edges than in the center, or vice verse.

Figure 6:
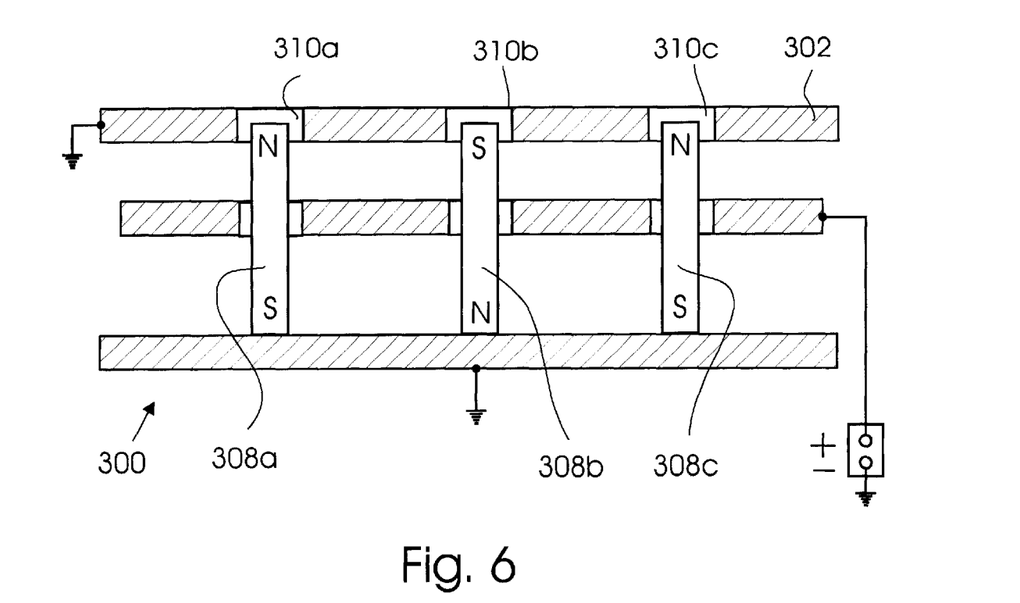
FIG. 6 is a multiple-cell ion-beam source of the invention with generation of magnetic fields in the cells by mean of permanent magnets.

An ion-beam source 300 according to another embodiment of the invention is shown in FIG. 6. This drawing is a fragmental view of multiple-cell ion-beam source 300 of the invention, which differs from the embodiment of FIG. 5 in that magnetic fields in the cells are generated by mean of permanent magnets 308a, 308b, 308c. The remaining elements of the source are the same and therefore are not shown in FIG. 6. It can be seen that, in accordance with the principle of the present invention, rod-like permanent magnets 308a , 308b, 308c have alternating polarities on their ends facing opening 310a, 310b, 310c of cathode plate 302. This eliminates accumulation of the magnetic flux towards the periphery of cathode plate 302.

Figure 7:
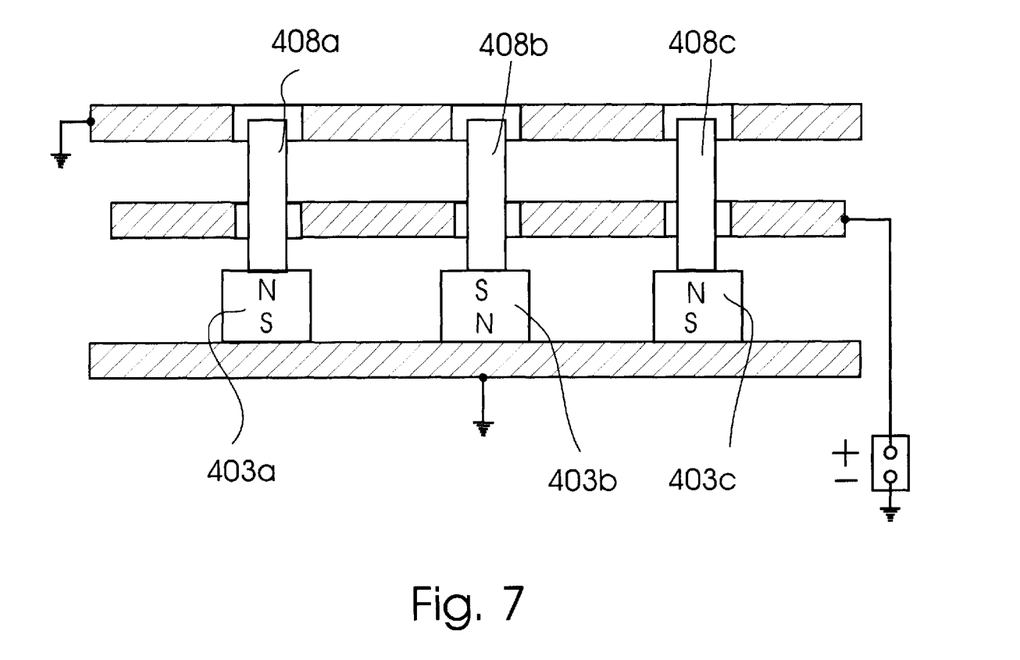
FIG. 7 is a fragmental sectional view illustrating arrangement of the magnets and rods for increasing the density of cells in the cathode plate.

FIG. 7 is a fragmental sectional view illustrating arrangement of magnets 403a, 403b, 403c and rods 408a, 408b, 408c for increasing the density of cells in the cathode plate. More specifically, in this embodiment of the invention, magnets 403a, 403b, 403c support respective rods 408a, 408b, 408c having diameters smaller than the transverse dimensions of the magnets. As a result, by arranging the magnets closer to each other, it becomes possible to reduce a pitch between adjacent cells, and hence, to increase density of cells in a cathode plate.

Figure 8:
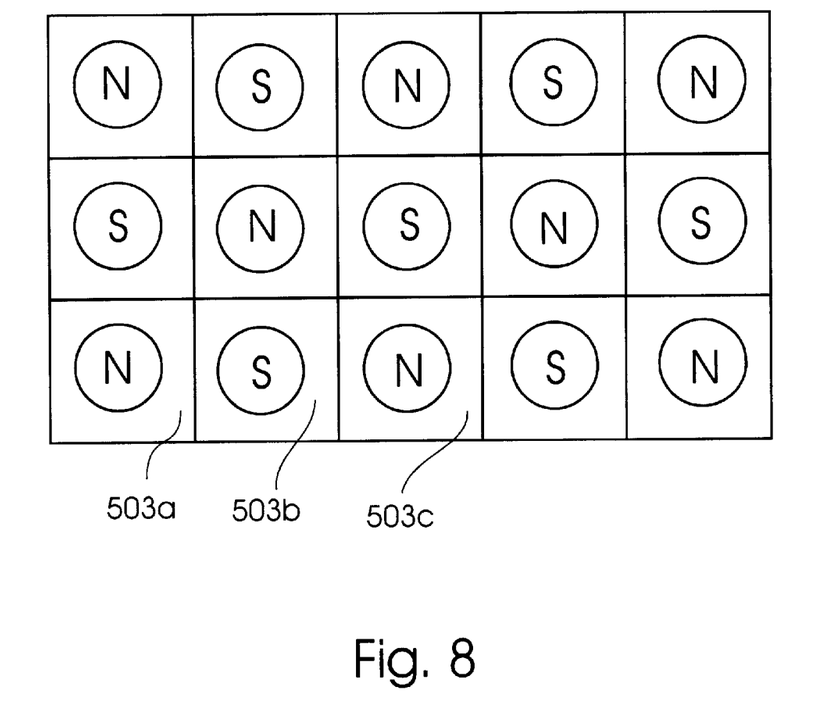
FIG. 8 is a sectional view along line VIII—VIII of FIG. 5 for the case of magnets of a square cross-section packed closely against each other.

As shown in FIG. 8, which is a fragmental plan view, magnets 503a, 503b, 503c, . . . may have a square cross-section and can be packed closely against each other.

Figure 9:
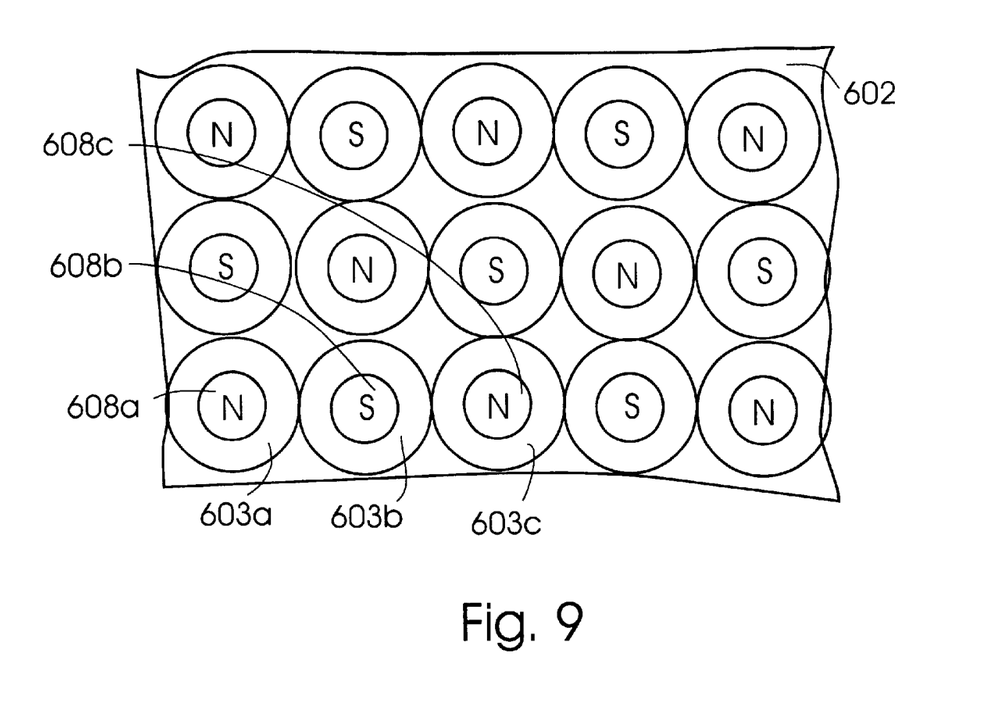
FIG. 9 is a sectional view along line VIII—VIII of FIG. 5 for the case of magnets of a round cross-section packed closely against each other.

FIG. 9 is a sectional view similar to FIG. 8 for the case of magnets 603a, 603b, 603c of a round cross-section packed closely against each other. Reference numerals 608a, 608b, 608c designate rods.

An increased number of cells in cathode plate 602 of the embodiment of FIG. 9, respectively, further improves uniformity in distribution of ion-current density on the surfaces of the treated objects.

Figure 10:
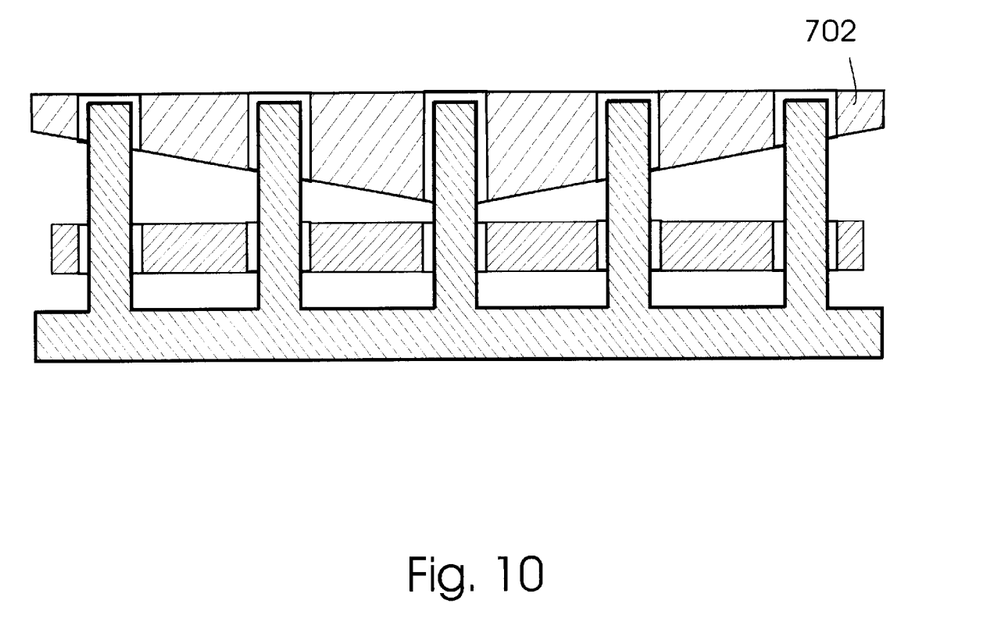
FIG. 10 is a view similar to FIG. 4 illustrating an embodiment of the invention where uniformity of ion-current density distribution is achieved by thickening the cathode plate towards the center.

FIG. 10 is a view similar to FIG. 4 illustrating another embodiment of the invention where uniformity of ion-current density distribution is achieved by thickening a cathode plate 702 towards its center proportionally to a decrease in the radius. As the thickness of the cathode plate increases toward the center, it becomes possible to compensate for an increase in the magnetic saturation toward the center.

Thus it has been shown that the invention provides a multiple-cell ion-beam source with electrons drifting in crossed electrical and magnetic fields, which is characterized by high uniformity in the distribution of ion-current density on the surface of the object, does not have limitations with regard to an increase in the cathode-plate diameter, and allows for control and adjustment in the distribution of the ion-current density on the surface of the object being treated.

Although the invention was shown and described with reference to specific embodiments having specific materials and shapes of the parts and units of the apparatus, it is understood that these embodiments were given only as examples and that any modifications and changes are possible, provided they do not depart from the scope of the patent claims attached below.

For example, three cells in a single row were shown only for simplification of the drawings, and the number of cells along the cross section of the ion source is more than 3. Cathode plate of variable thickness can be turned upside down as compared to the position in FIG. 10. The magnets, rods, and cathodes themselves may have a rectangular shape in a plane view. The individual electromagnetic coils can be adjusted and controlled by means other than variable resistors.

What is claimed is:

1. An ion-beam source with uniform distribution of ion-current density on the surface of an object being treated, comprising: a sealed housing connected to a source of vacuum; an anode means and a cathode means located in said housing, said anode means being spaced from said cathode means; an object to be treated having a surface to be treated facing said cathode means, a working gas supply means for the supply said working gas into a space between said anode means and said cathode means; means for applying to said anode means a potential positive with respect to said cathode means; a plurality of individual cells, each having an individual closed-loop ion-emitting slit and an individual magnet for generating a magnetic field in said individual ion-emitting slit, said means for applying to said anode means a potential positive with respect to said cathode means generating an electric field across said individual closed-loop ion-emitting slit in a direction perpendicular to said magnetic field, and means for providing uniform distribution in ion-beam current density on said surface of said object.

2. The ion-beam source of claim 1, wherein said means for providing uniform distribution comprises poles of said magnets having alternating polarities in all adjacent magnets, so that adjacent cells have opposite directions of magnetic lines of forces in said magnetic fields.

3. The ion beam source of claim 2, wherein said magnets are electromagnets, each comprising a rod-like body of a magnetizable material, an electromagnetic coil for generating said poles of said magnets, and an electric power source having a positive terminal and a negative terminal for connection to said electromagnetic coil, said positive and negative terminals of adjacent electric power sources being connected to respective adjacent coils in alternating orders in such a way that said poles of adjacent magnets have alternating polarities.

4. The ion beam source of claim 2, wherein said magnets are permanent magnets.

5. The ion beam source of claim 4, wherein each said permanent magnet is magnetically connected to a rod of a magnetoconductive material which extends toward said ion-emitting slit and has a transverse dimension smaller than the transverse dimension of said magnet.

6. The ion beam source of claim 5, wherein said magnets have square cross sections and are arranged so that adjacent magnets are in contact with each other.

7. The ion beam source of claim 5, wherein said magnets have a round cross sections and are arranged so that adjacent magnets are in contact with each other.

8. The ion-beam source of claim 1, wherein said means for providing uniform distribution comprises said cathode means in the form of a cathode plate having thickness decreasing in each point from the center of said cathode plate toward the periphery of said cathode plate in proportion to the distance from said center to said point.

9. A method for providing uniformity in distribution of ion current density on the surface of an object being treated by an ion-beam source, comprising:
  providing a multiple-cell ion-beam source with an anode, cathode, a plurality of individual closed-loop ion-emitting slits in said cathode on the side of said object, and means for generating crossed electric and magnetic fields in each said ion-emitting slit;
  supplying a working medium into a space between said anode and said cathode;
  generating said crossed electric and magnetic fields in each of said ion-emitting slits and causing drift of electrons in said ion-emitting slits;
  ionizing said working medium, and generating an ion beam through each said ion-emitting slit; and
  providing uniformity in distribution of the ion-current density on the surface of said object by generating said magnetic fields with alternating directions of magnetic lines of forces in adjacent ion-emitting slits.

10. The method of claim 9, further comprising a step of adjusting magnetic fields in said individual closed-loop ion-emitting slits.

11. An ion-beam source for uniform treatment of objects having large surface area, comprising:
  a first cathode plate;
  a second cathode plate spaced from said first cathode plate;
  an anode plate placed between said first cathode plate and said second cathode plate, said first cathode plate having a plurality of through openings, said second cathode plate supporting a plurality of magnets extending toward said through openings of said first cathode plate via said openings of said anode and coaxial to said openings so that the end of each said magnet and each said respective opening in said first cathode plate form a closed-loop ion-emitting slit;
  means for the supply of a working medium to a space between said first cathode plate and said anode;
  means for generating a potential difference between said anode and said first cathode plate for generating electric fields across said ion-emitting slits; said magnets generating magnetic fields which are perpendicular to said electric fields, said adjacent magnets having alternating polarities.

12. The ion beam source of claim 11, wherein said magnets are permanent magnets.

13. The ion beam source of claim 12, wherein each said permanent magnet is magnetically connected to a rod of a magnetoconductive material which extends toward said ion-emitting slit and has a transverse dimension smaller than the transverse dimension of said magnet.

14. The ion beam source of claim 13, wherein said magnets have square cross sections and are arranged so that adjacent magnets are in contact with each other.

15. The ion beam source of claim 13, wherein said magnets have a round cross sections and are arranged so that adjacent magnets are in contact with each other.

16. The ion beam source of claim 11, wherein said magnets are electromagnets, each comprising a rod-like body of a magnetizable material, an electromagnetic coil for generating said poles of said magnets, and an electric power source having a positive terminal and a negative terminal for connection to said electromagnetic coil, said positive and negative terminals of adjacent electric power sources being connected to respective adjacent coils in alternating orders in such a way that said adjacent magnets have alternating polarities.

* * * * *